(12) United States Patent
Wang et al.

(10) Patent No.: US 9,922,934 B2
(45) Date of Patent: Mar. 20, 2018

(54) SEMICONDUCTOR MANUFACTURING PROCESS AND PACKAGE CARRIER

(71) Applicant: Taiwan Semiconductor Manufacturing Co., Ltd., Hsinchu (TW)

(72) Inventors: Shih-Hui Wang, New Taipei (TW); Chih-Hung Cheng, Hsinchu (TW); Yung-Chi Lin, New Taipei (TW); Wen-Chih Chiou, Miaoli County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/141,836

(22) Filed: Apr. 29, 2016

(65) Prior Publication Data
US 2017/0317033 A1 Nov. 2, 2017

(51) Int. Cl.
*H01L 23/544* (2006.01)
*G03F 9/00* (2006.01)
*H01L 21/683* (2006.01)
*H01L 21/3105* (2006.01)
*H01L 23/00* (2006.01)

(52) U.S. Cl.
CPC ........ *H01L 23/544* (2013.01); *H01L 21/3105* (2013.01); *H01L 21/6835* (2013.01); *H01L 24/11* (2013.01); *H01L 2221/6835* (2013.01); *H01L 2221/68359* (2013.01); *H01L 2223/5442* (2013.01); *H01L 2223/54426* (2013.01); *H01L 2224/11002* (2013.01); *H01L 2224/11005* (2013.01)

(58) Field of Classification Search
CPC ......... H01L 23/544; H01L 2223/54426; H01L 2221/68359; H01L 2223/5442; H01L 21/6835; H01L 2221/6835; H01L 2224/11; H01L 24/11; H01L 2224/11002; H01L 2224/11005; H01L 21/3105
See application file for complete search history.

(56) References Cited

U.S. PATENT DOCUMENTS

2015/0115318 A1* 4/2015 Park ................. H01L 31/03048
257/184

FOREIGN PATENT DOCUMENTS

FR 2833518 * 6/2003 ............ B41M 5/237

* cited by examiner

*Primary Examiner* — Jasmine Clark
(74) *Attorney, Agent, or Firm* — JCIPRNET (57) ABSTRACT

A package carrier includes a carrier and a light absorption layer. The light absorption layer is disposed on the carrier. The light absorption layer includes a notch at the periphery of the carrier, and the notch is light transmissive so as to expose the carrier to light in a normal direction of the carrier. A semiconductor manufacturing process is also provided.

20 Claims, 10 Drawing Sheets

SEMICONDUCTOR MANUFACTURING PROCESS AND PACKAGE CARRIER

BACKGROUND

During some semiconductor processes, carriers are provided for semiconductor packages or semiconductor assemblies. In order to process the semiconductor packages or assemblies, the carriers need to be aligned by the machine performing the process. In order to align the carriers, the carriers may be marked. It is preferable for the carrier to be reusable for multiple processes. Thus, when marking the carrier, it is preferred to reduce the damage to the carrier so as to retain the reliability of the carrier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
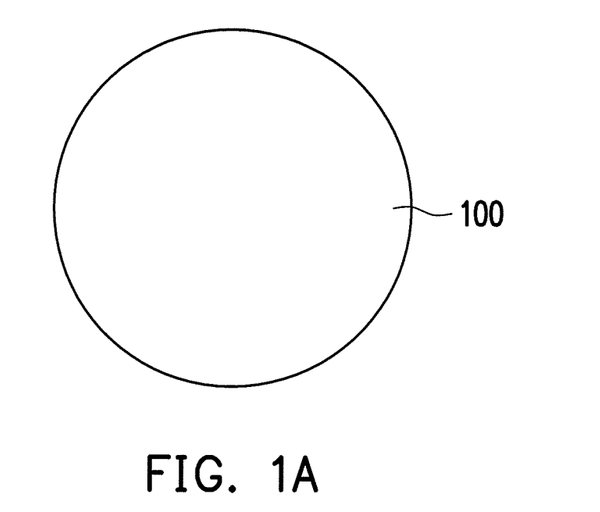
FIG. 1A to FIG. 1D are schematic top views illustrating a semiconductor manufacturing process according to an embodiment of the present disclosure.

FIG. 1A to FIG. 1D are schematic top views illustrating a semiconductor manufacturing process according to an embodiment of the present disclosure. FIG. 2A to FIG. 2D are schematic cross sectional views illustrating the semiconductor manufacturing process of FIG. 1. Referring to FIG. 1A and FIG. 2A, in the embodiment, a carrier 100 is provided. The carrier 100 may be any suitable type of carrier for a semiconductor manufacturing process. Specifically, the carrier 100 may be a suitable carrier for a packaging process or a semiconductor package. The semiconductor package may be, for example, integrated fan out technology, chip on wafer on substrate (CoWoS), or other semiconductor packages known to one of ordinary skill in the art. Herein, the material of the carrier 100 may be glass, but the scope of the present disclosure is not limited thereto. The material of the carrier 100 may be any suitable material for a packaging process or a semiconductor package.

Figure 1B:
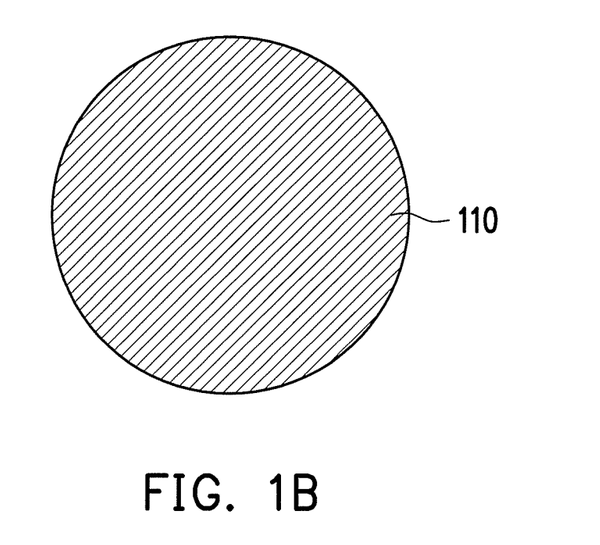
Figure 2A:
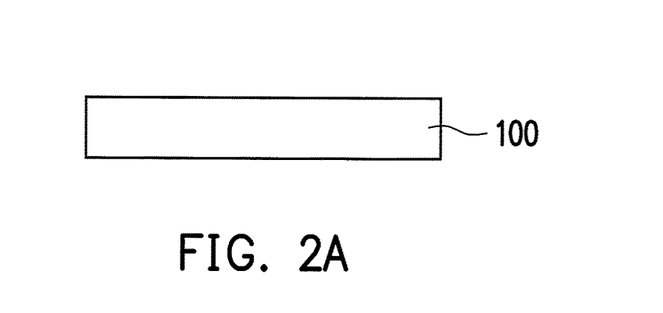
FIG. 2A to FIG. 2D are schematic cross sectional views illustrating the semiconductor manufacturing process of FIG. 1A to FIG. 1D.
Figure 2B:
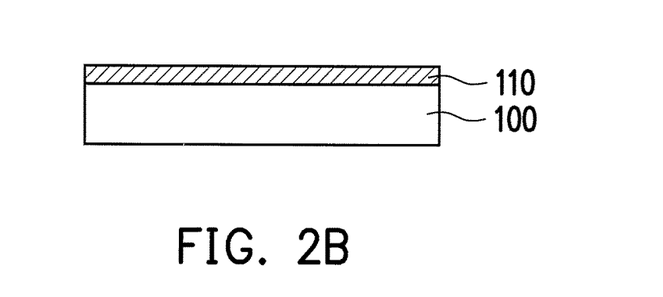

Referring to FIG. 1B and FIG. 2B, in the embodiment, the carrier 100 is coated with a light absorption layer 110. In some embodiments, the light absorption layer 110 includes a colorant. The colorant may absorb infrared laser wavelengths. However, the scope of the present disclosure is not limited thereto. The light absorption layer 110 may also absorb wavelengths from different kinds of light, including visible light and invisible light. The light absorption layer 110 may absorb any kind of light so that light does not reach the carrier 100. Of course, the light absorption layer 110 is not required to include the colorant, but may be any other suitable material of absorbing light. The method of coating the light absorption layer 110 on the carrier 100 may be performed through spin coating. However, the scope of the present disclosure is not limited thereto. The user may coat the light absorption layer 110 on the carrier 100 through any other suitable methods.

Figure 1C:
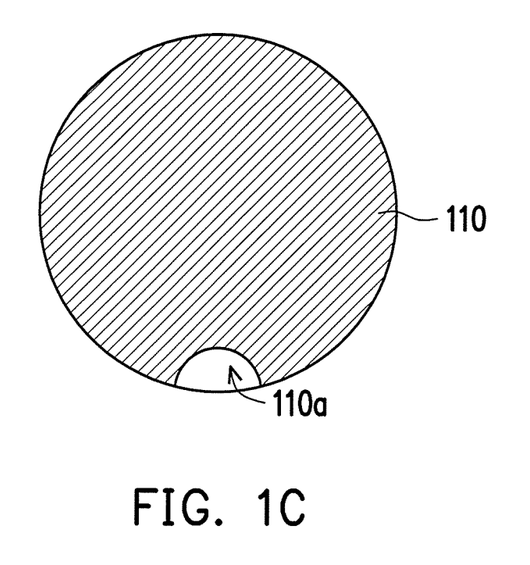
Figure 2C:
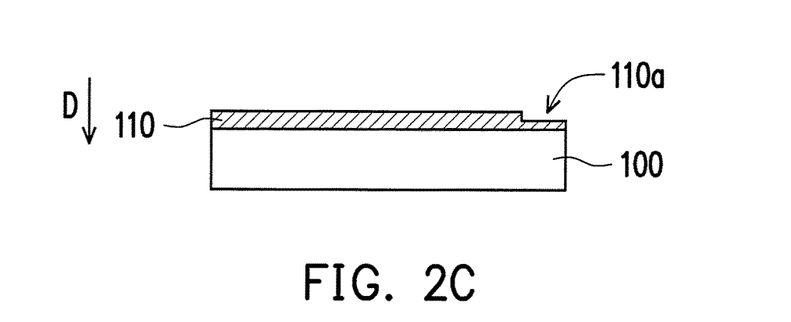

Referring to FIG. 1C and FIG. 2C, in the embodiment, a portion of the light absorption layer 110 is removed at a periphery of the carrier 100 to form a notch 110a in the light absorption layer 110 at the periphery of the carrier 100. The notch 110a is light transmissive so as to expose the carrier 100 to light in a normal direction D of the carrier 100. The light absorption layer 110 is removed in the thickness direction, or normal direction D, so that the thickness of the light absorption layer 110 at the notch 110a is less than a thickness of the rest of the light absorption layer 110. That is to say, as seen in FIG. 2C, the thickness of the light absorption layer 110 at the notch 110a is reduced by the removal of the portion of the light absorption layer 110. In some embodiments, the thickness of the rest of the light absorption layer 110 is not light transmissive. In the embodiment, the notch 110a is formed by removing only a portion of the thickness of the light absorption layer 110 at the specific location on the periphery of the carrier 100. As seen in FIG. 2C, a thickness of the light absorption layer 110 at the notch 110a still remains, but is less than the thickness of the rest of the light absorption layer 110. Specifically, the portion of the light absorption layer 110 is partially removed in the normal direction D so that the notch 110a in the light absorption layer 110 is at least 10 percent light transmissive, so as to expose the carrier 100 to light. The light that is exposed to the carrier 100 may be, for example, infrared light. However, the light may also be any suitable type of light. That is it say, the light may be visible light or invisible light. The amount of thickness of the light absorption layer 110 at the notch 110a that is partially removed may be determined according to the user as long as the remaining thickness of the light absorption layer 110 at the notch 110a is at least 10 percent light transmissive. Specifically, the thicker the thickness of the light absorption layer 110 at the notch 110a, the less light transmissive the notch 110a is, and the thinner the thickness of the light absorption layer 110 at the notch 110a, the more light transmissive the notch 110a is. In some embodiments, the notch 110a is 10 percent to 90 percent light transmissive. In other embodiments, the notch 110a may be at least 10 percent to 50 percent light transmissive. However, the scope of the present disclosure is not limited thereto, and the notch 110a only has to be substantially 10 percent light transmissive.

In the embodiment, the notch 110a is light transmissive to the light exposed to the carrier 100 so as to align the carrier 100. That is to say, the machine the is processing the carrier 100 during a packaging process or a semiconductor manufacturing process may use the notch 110a as an alignment mark so as to perform precise actions towards the carrier 100 or any objects disposed on the carrier 100. The notch 110a acting as an alignment mark may expose the carrier 100 to any suitable type of light so that the machine can precisely align the carrier 100 through the notch 110a. As such, the carrier 100 is not altered or cut to include a mark. Rather, the light absorption layer 110 on the carrier 100 is processed by removing a portion of the light absorption layer 110 at the periphery of the carrier 100 so as to create a notch 110a. This way, the carrier 100 is not damaged and may be a more robust carrier.

In the embodiment, as seen in FIG. 1C, the shape of the notch 110a is a semicircle. However, the scope of the present disclosure is not limited thereto. The shape of the notch 110a can be a rectangle, a square, a triangle, or any other suitable shape desired by the user. In addition, the method of removing the portion of the light absorption layer 110 at the periphery of the carrier 100 may be performed through, for example, laser removing. However, the scope of the present disclosure is not limited thereto. The portion of the light absorption layer 110 removed to form the notch 110a may be removed through any other suitable methods known to one of ordinary skill in the art. Herein, the manufacturing process of marking the carrier 100 in the semiconductor manufacturing process of the embodiment is complete, and the carrier 100 may be further processed with other semiconductor layers. Further processing may require the carrier 100 to be aligned, but some processes may not require the carrier 100 to be aligned.

Figure 1D:
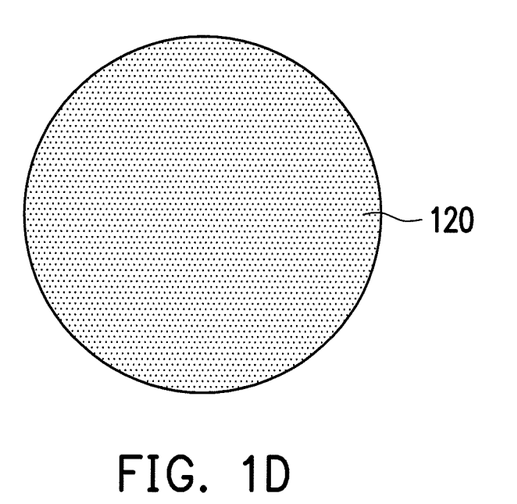
Figure 2D:
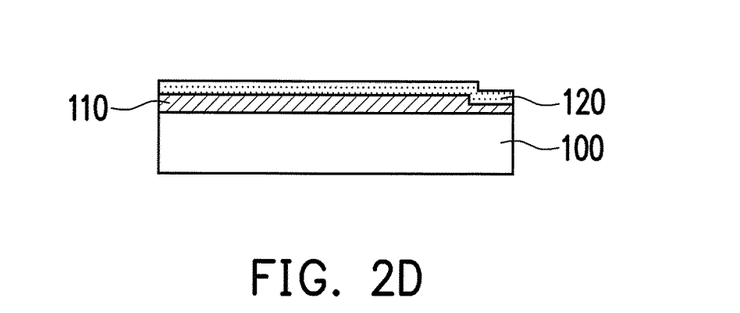

For example, referring to FIG. 1D and FIG. 2D, a semiconductor layer 120 may be provided on the light absorption layer 110 and the notch 110a. The semiconductor layer 120 may be provided through deposition, sputtering, lamination, printing, coating, or any other suitable method. The semiconductor layer 120 may be any type of semiconductor layer for any semiconductor manufacturing process. For example, the semiconductor layer 120 may be for further semiconductor manufacturing processes or for forming a semiconductor package. Therefore, the step of providing the semiconductor layer 120 in FIG. 1D and FIG. 2D may be a step in a semiconductor packaging process.

In some embodiments, the semiconductor packaging process may be part of a wafer level packaging process and one or more semiconductor wafers, dies and/or semiconductor devices may be provided and packaged during the packaging process. In some embodiments, the semiconductor layer 120 includes, for example, one or more polymer layers, insulating layers, adhesive layers or dielectric layers. In some embodiments, the semiconductor layer 120 further includes metallization structures and/or contact pads. At least one semiconductor wafer, die(s) or semiconductor device(s) is disposed on the semiconductor layer 120 and overmolded by a molding compound. In some embodiments, interconnect structures such as through assembly vias (TAVs) are formed in the molding compound along with at least one redistribution layer and bump/ball pads for further electrical connection. In some embodiments, the carrier 100 is then debonded, and connection elements such as solder balls or ball grid array bumps are disposed on the bump/ball pads. The scope of the present disclosure is not limited thereto. The semiconductor layer of the semiconductor packaging process may be varied depending on the process steps or technology applied for the packaging process. The above description is only one example of a semiconductor packaging process to illustrate what the semiconductor layer 120 may be.

In the embodiment, the semiconductor manufacturing process may further include debonding the light absorption layer 110 from the carrier 100. The light absorption layer 110 is adapted to be debonded from the carrier 100 so that the carrier 100 may be used again for another semiconductor manufacturing process. That is to say, the material of the light absorption layer 110 is also a material suitable to be debonded from the carrier 100. The step of debonding the light absorption layer 110 from the carrier 100 may be performed after a semiconductor package or package assembly is formed on the carrier 100. This way, the semiconductor package may be removed from the carrier 100 and the carrier 100 may be used again for the semiconductor manufacturing process or other semiconductor manufacturing processes. Since the light absorption layer 110 is suitable to be debonded from the carrier, the carrier 100 may be reused for additional semiconductor manufacturing processes.

Figure 3A:
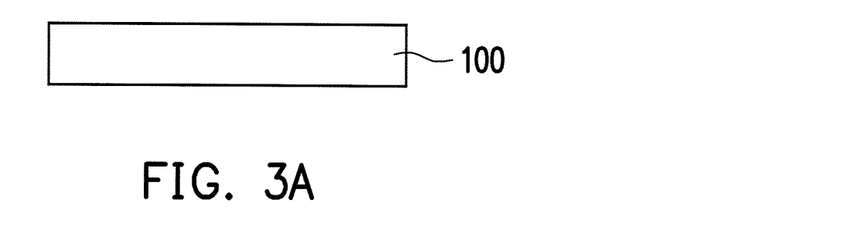
FIG. 3A to FIG. 3D are schematic cross sectional views illustrating a semiconductor manufacturing process according to another embodiment of the invention.
Figure 3B:
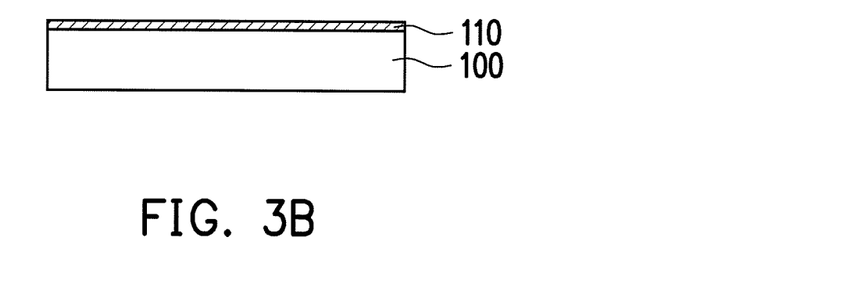

FIG. 3A to FIG. 3D are schematic cross sectional views illustrating a semiconductor manufacturing process according to another embodiment of the invention. The embodiment of FIG. 3A to FIG. 3D is similar to the embodiment of FIG. 1A to FIG. 1D and FIG. 2A to FIG. 2D. Similar elements will use the same reference numbers. Specifically, the steps of FIG. 3A and FIG. 3B are the same as the steps in FIG. 2A and FIG. 2B, respectively, and the same description will not be repeated herein.

Figure 3C:
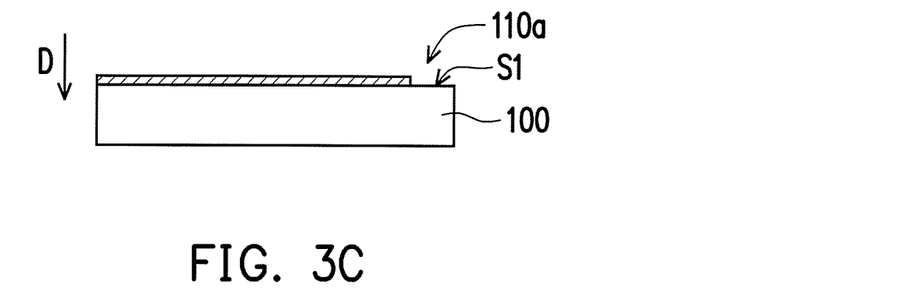

Referring to FIG. 3C, in the embodiment, the step of FIG. 3C is similar to the step of FIG. 2C. The same descriptions can be referred to in the above description. The difference between the embodiments is that in the embodiment of FIG. 3C, the portion of the light absorption layer 110 that is removed to form the notch 110a is removed in the normal direction D to the carrier 100 so as to expose a surface S1 of the carrier 100. That is to say, at the notch 110a, the light absorption layer 110 no longer remains. The light absorption layer 110 at the removed portion at the periphery of the carrier 100 is removed so that the light absorption layer 110 no longer exists at the notch 110a. As such, the light transmissivity of the notch 110a is 100 percent, because the notch 110a directly exposes the surface S1 of the carrier 100.

Figure 3D:
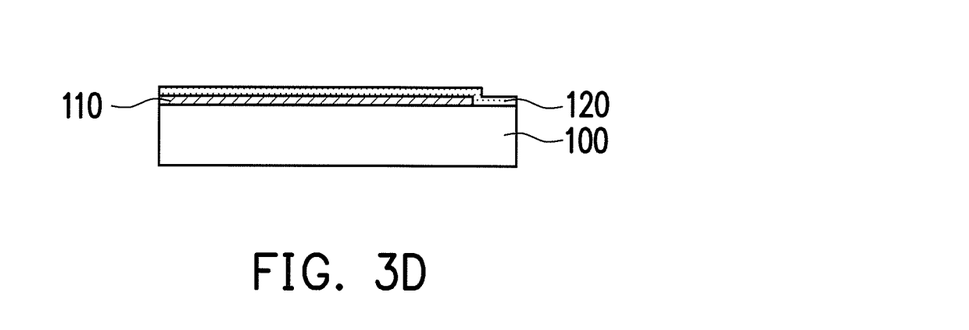

Referring to FIG. 3D, the description of FIG. 3D is similar to the description of FIG. 1D and FIG. 2D, and can be referred to above. The difference is that the semiconductor layer 120 may be provided on the light absorption layer 110 and the notch 110a which exposes the surface S1 of the carrier 100. Thus, part of the semiconductor layer 120 may be provided on the surface S1 of the carrier 100. The method of providing the semiconductor layer 120 may be referred to in the above embodiment, and will not be repeated herein. In addition, the light absorption layer 110 may also be adapted to be debonded from the carrier 100, and the description may also be referred to in the above embodiment.

Figure 4A:
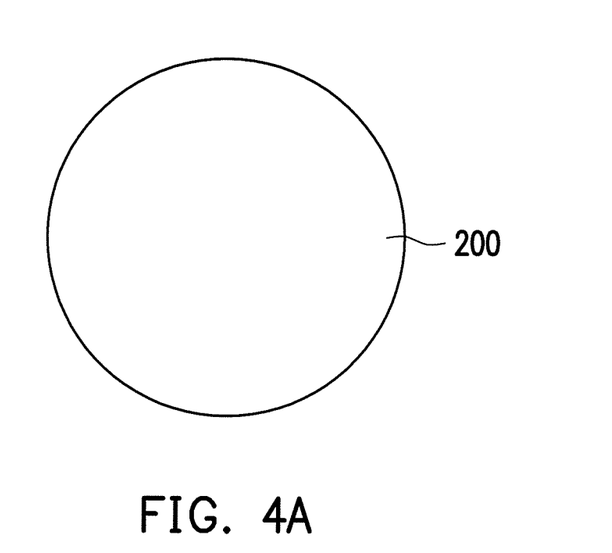
FIG. 4A to FIG. 4F are schematic top views illustrating a semiconductor manufacturing process according to another embodiment of the present disclosure.

FIG. 4A to FIG. 4F are schematic top views illustrating a semiconductor manufacturing process according to another embodiment of the present disclosure. FIG. 5A to FIG. 5F are schematic cross sectional views illustrating the semiconductor manufacturing process of FIG. 4A to FIG. 4F. Referring to FIG. 4A and FIG. 5A, in the embodiment, a carrier 200 is provided. The carrier 200 is similar to the carrier 100 of FIG. 1A, and the same description will not be repeated herein.

Figure 4B:
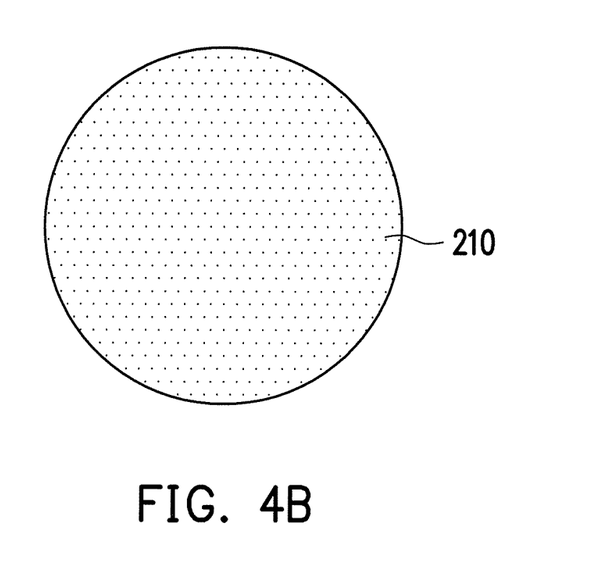
Figure 5A:
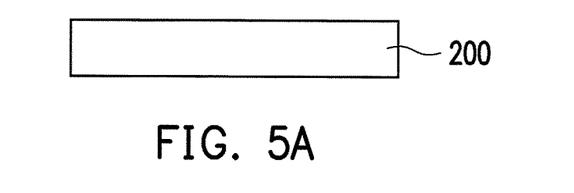
FIG. 5A to FIG. 5F are schematic cross sectional views illustrating the semiconductor manufacturing process of FIG. 4A to FIG. 4F.
Figure 5B:
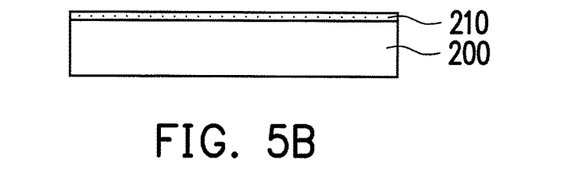

Referring to FIG. 4B and FIG. 5B, in the embodiment, the carrier 200 is coated with a first light absorption layer 210. The first light absorption layer 210 may be similar to the light absorption layer 110 in FIG. 1B. The method of coating the first light absorption layer 210 may be similar to the description in FIG. 1B and FIG. 2B, and the same description will not be repeated herein. In the embodiment, the thickness of the first light absorption layer 210 is light transmissive so that light may pass through the first light absorption layer 210. The light of the embodiment may be the same as the light of the embodiment in FIG. 1A to FIG. 1D, and the same description will not be repeated herein. The thickness of the first light absorption layer 210 may be adjusted according to the desired light transmissivity of the first light absorption layer 210. In the embodiment, the light transmissivity of the first light absorption layer 210 is at least 10 percent. In some embodiments, the light transmissivity of the first light absorption layer 210 may be 10 percent to 50 percent. The scope of the present disclosure is not limited thereto, and the light transmissivity of the first light absorption layer 210 may be adjusted according to the thickness of the first light absorption layer 210 coated on the carrier 200. Specifically, the thicker the thickness of the first light absorption layer 210 the less light transmissive the first light absorption layer 210 is, and the thinner the thickness of the light absorption layer 110, the more light transmissive the light absorption layer 110 is.

Figure 4C:
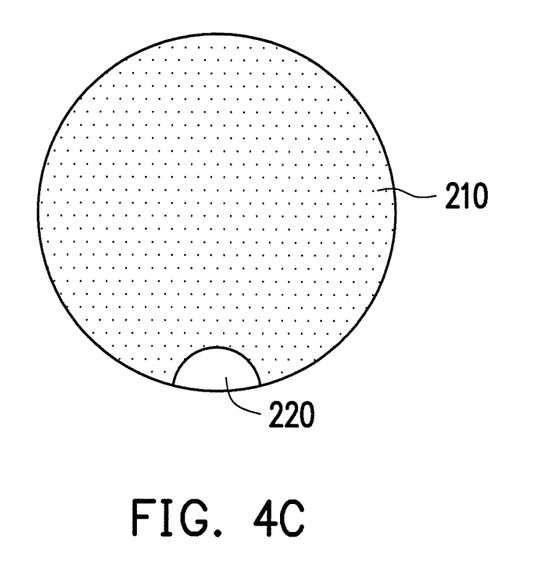
Figure 5C:
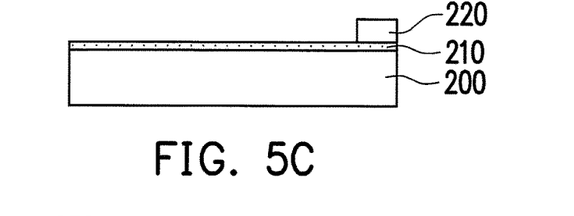

Referring to FIG. 4C and FIG. 5C, in the embodiment, a cover 220 is disposed at a periphery of the carrier 200 and on the first light absorption layer 210. The cover 220 may be, for example, a fastener that is fastened or a clamp that is clamped onto the carrier. However, the scope of the present disclosure is not limited thereto. The cover may also be any other suitable type of fastener or cover that may be fastened or disposed onto the periphery of the carrier 200.

Figure 4D:
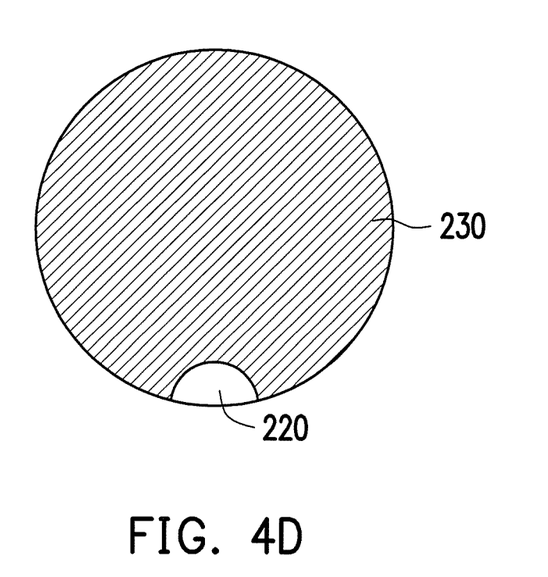
Figure 5D:
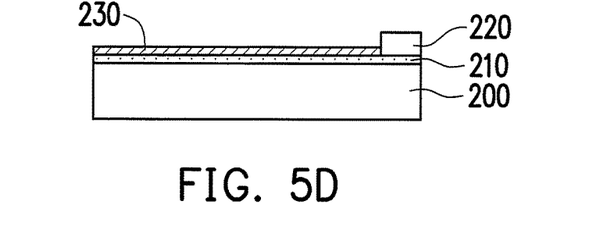

Referring to FIG. 4D and FIG. 5D, in the embodiment, a second light absorption layer 230 is coated onto the first light absorption layer 210 of the carrier 200. In the embodiment, the second light absorption layer 230 may be coated similarly to the first light absorption layer 210. In addition, the second light absorption layer 230 may be the same material as the first light absorption layer 210. However, the scope of the present disclosure is not limited thereto. The second light absorption layer 230 may also be a different material from the first light absorption layer 210. That is to say, the second light absorption layer 230 may be a different material from the first light absorption layer 210 but has the same properties of absorbing light and being a debonding layer. As the second light absorption layer 230 is coated completely onto the carrier 200, the first light absorption layer 210 is covered. The cover 220 may be coated and may also not be coated with the second light absorption layer 210, as long as the first light absorption layer 210 is completely coated and covered by the second light absorption layer 230. Since the cover 220 is disposed onto the carrier 200 and covers a portion of the first light absorption layer 210, the second light absorption layer 230 is unable to be coated onto the portion of the first light absorption layer 210 covered by the cover 220.

Figure 4E:
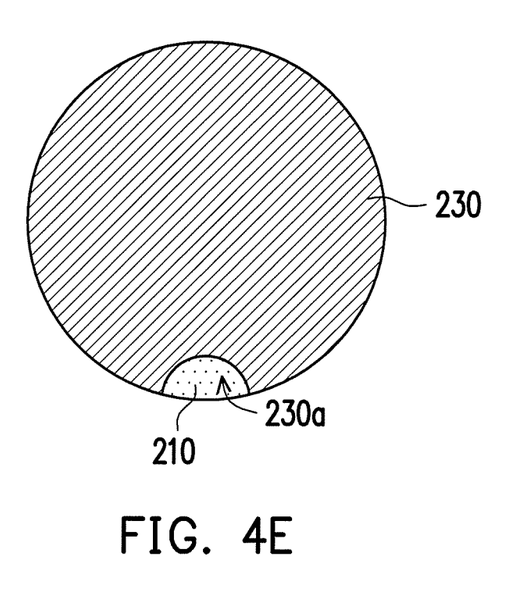
Figure 5E:
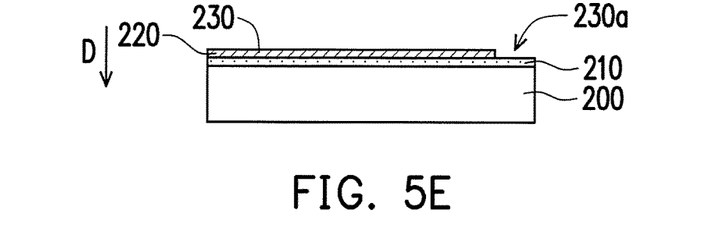

Referring to FIG. 4E and FIG. 5E, in the embodiment, the cover 220 is then removed from the carrier 200. After the cover 220 is removed, a notch 230a is revealed at the periphery of the carrier 200, where the cover 220 previously was. The notch 230a was formed when the second light absorption layer 230 was coated onto the first light absorption layer 210. However, the portion of the first light absorption layer 210 that was covered over by the cover was not coated by the second light absorption layer 230. Therefore, after the cover 220 is removed, the notch 230a is formed which reveals the first light absorption layer 210. The notch 230a is light transmissive so as to expose the carrier 200 to light in a normal direction D of the carrier 200. That is to say, because the first light absorption layer 210 is light transmissive as described in the description of FIG. 4B and FIG. 5B, the notch 230a which exposes the first light absorption layer 210 is light transmissive so as to expose the carrier 200 to light in the normal direction D. In addition, in some embodiments, the thickness of the first light absorption layer 210 and the second light absorption layer 230 together is not light transmissive.

In the embodiment, as seen in FIG. 4E, the shape of the notch 230a is a semicircle. However, the scope of the present disclosure is not limited thereto. The shape of the notch 230a is a rectangle, a square, a triangle, or any other suitable shape desired by the user. The shape of the notch 230a is determined by the shape of the cover 220, which is also a semicircle as seen in FIG. 4D. Similarly, the shape of the cover 220 may be any other suitable shape desired by the user, which forms the shape of the notch 230a. The notch 230a may be used to align the carrier 200, similar to the notch 110a, and the same description will not be repeated herein.

Figure 4F:
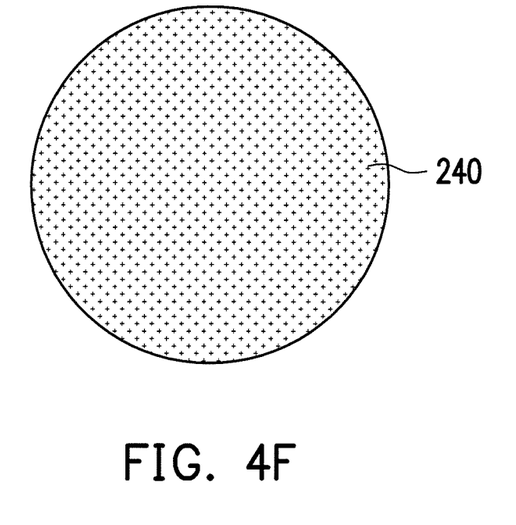
Figure 5F:
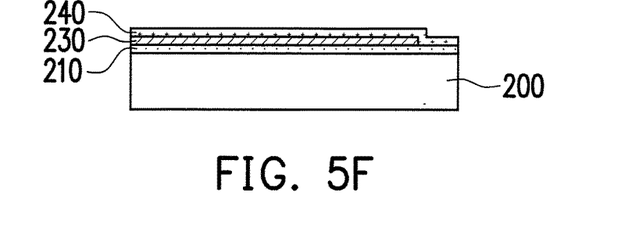

Referring to FIG. 4F and FIG. 5F, a semiconductor layer 240 is provided on the carrier 200. The semiconductor layer 240 covers the second light absorption layer 230 and the notch 230a. The description of providing the semiconductor layer 240 is similar to the description in FIG. 1D and FIG. 2D, and can be referred to above. In the embodiment, the semiconductor manufacturing process may further include providing a semiconductor package on the second light absorption layer 230 or on the semiconductor layer 240. Depending on the semiconductor manufacturing process and user requirements, the semiconductor package may also be provided on additional film layers that may be coated onto the carrier 200. The scope of the present disclosure is not limited thereto. In addition, the first light absorption layer 210 and the second light absorption layer 230 may also be adapted to be debonded from the carrier 200, and the description may also be referred to in the previous embodiment.

Figure 6A:
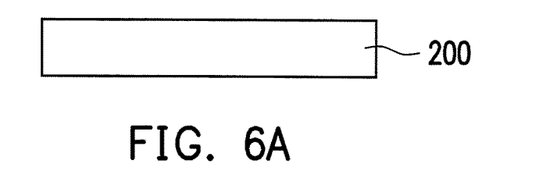
FIG. 6A to FIG. 6E are schematic cross sectional views illustrating a semiconductor manufacturing process according to another embodiment of the invention.

FIG. 6A to FIG. 6E are schematic cross sectional views illustrating a semiconductor manufacturing process according to another embodiment of the invention. The embodiment of FIG. 6A to FIG. 6E is similar to the embodiment of FIG. 4A to FIG. 4F and FIG. 5A to FIG. 5F. Similar elements will use the same reference numbers. Specifically, the step of FIG. 6A is the same as the step in FIG. 5A, and the same description will not be repeated herein.

Figure 6B:
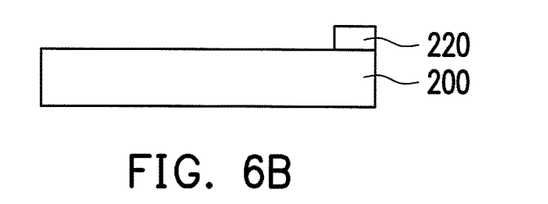

Referring to FIG. 6B, in the embodiment, the cover 220 is directly disposed onto the carrier 200. The step in FIG. 5B of first coating a first absorption layer 210 is omitted in the embodiment of FIG. 6A to FIG. 6E. The description of the cover 220 can be referred to in the description of FIG. 5C, and will not be repeated herein.

Figure 6C:
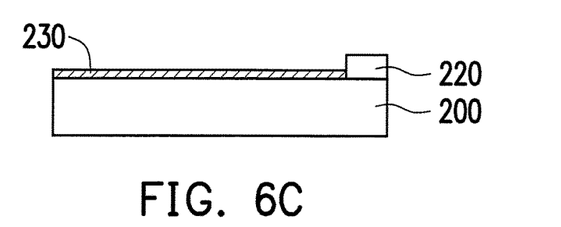

Referring to FIG. 6C, in the embodiment, the second light absorption layer 230 is coated onto the carrier 200. The description of the second light absorption layer 230 and the method of coating the second light absorption layer 230 are similar to the description of FIG. 4D and FIG. 5D, and the same description will not be repeated herein. The difference is that in the embodiment, the second light absorption layer 230 is coated directly on the surface of the carrier 200, and not onto the first light absorption layer. In addition, the portion of the cover 220 disposed at the periphery of the carrier 200 covers the carrier 200. Thus, the second light absorption layer 230 is not coated onto the portion of the carrier 200 covered by the cover 220.

Figure 6D:
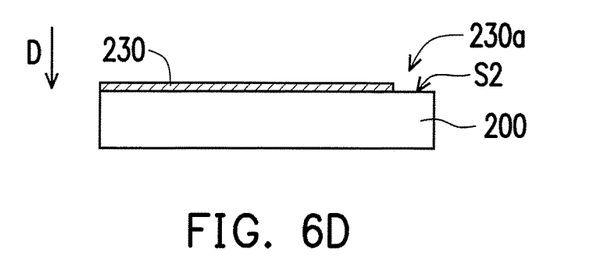

Referring to FIG. 6D, the description of FIG. 6D is similar to the description of FIG. 4E and FIG. 5E. The same descriptions will not be repeated herein. The difference is that the notch 230a revealed and formed after removing the cover 220 directly exposes a surface S2 of the carrier 200. Thus, the notch 230a is 100 percent light transmissive because there is no light absorption layer blocking the surface S2 of the carrier 200 at the notch 230a.

Figure 6E:
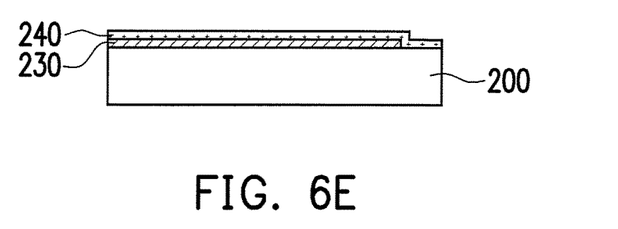

Referring to FIG. 6E, the description of FIG. 6E is similar to the description of FIG. 4F and FIG. 5F. The same descriptions will not be repeated herein. The difference is that the semiconductor layer 240 is provided on the second light absorption layer 230 and may also be provided and in contact with the surface S2 of the carrier 200. In addition, the second light absorption layer 230 may also be adapted to be debonded from the carrier 200, and the description may also be referred to in the previous embodiment.

Referring to FIG. 2D and FIG. 5F, the structures shown may be referred to as a package carrier. In the package carriers of FIG. 2D and FIG. 5F, the notches 110a, 230a include the light absorption layer at a thickness that is light transmissive so as to expose the carrier 100, 200 to light in a normal direction D of the carrier 100, 200. That is to say, a thickness of the light absorption layer at the notch 110a, 230a is less than a thickness of the rest of the light absorption layer disposed on the carrier 100, 200.

Referring to FIG. 3D and FIG. 6E, the structures shown may be referred to as a package carrier. In the package carriers of FIG. 3D and FIG. 6E, the notches 110a, 230a expose the surface of the carrier, and so the notches 110a, 230a are light transmissive so as to expose the carrier 100, 200 to light in a normal direction D of the carrier 100, 200.

In the above embodiments, the notches 110a, 230a are not drawn to scale. The notches 110a, 230a shown in figures may be bigger to more clearly show the shape of the notches 110a, 230a or the layers underneath the notches 110a, 230a. The notches 110a, 230a may be smaller as required by the user.

Figure 7:
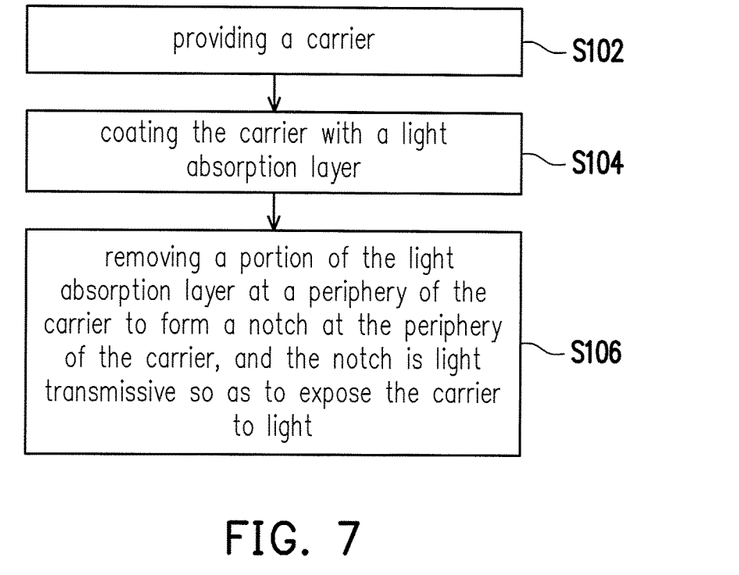
FIG. 7 is a flow chart of a semiconductor manufacturing process according to an embodiment of the invention.

FIG. 7 is a flow chart of a semiconductor manufacturing process according to an embodiment of the invention. In the embodiment, the semiconductor manufacturing process includes providing a carrier (step S102). The detailed description may be referred to in the description of FIG. 1A and FIG. 2A. Next, the semiconductor manufacturing process includes coating the carrier with a light absorption layer (step S104). The detailed description of may be referred to in the description of FIG. 1B and FIG. 2B. Next, a portion of the light absorption layer at a periphery of the carrier is removed (step S106). The portion of the light absorption layer that is removed may only be partially removed in the thickness direction of the light absorption layer. The detailed description may be referred to in the description of FIG. 1C and FIG. 2C. Of course, the portion of the light absorption layer may also be completely removed to expose the surface of the carrier. The detailed description may be referred to in the description of FIG. 3C. Thus, a notch is formed in the light absorption layer at the periphery of the carrier, and the notch is light transmissive so as to expose the carrier to light in a normal direction of the carrier. In some embodiments, the semiconductor manufacturing process may also include providing a semiconductor layer on the light absorption layer, and providing a semiconductor package on the carrier. The semiconductor manufacturing process may also include debonding the light absorption layer from the carrier. The same description can be referred to in the previous embodiments.

Figure 8:
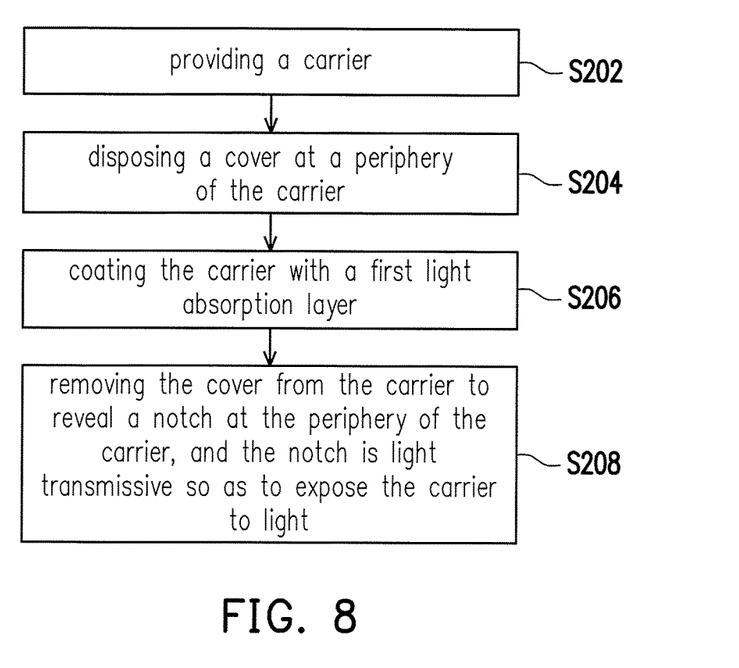
FIG. 8 is a flow chart of a semiconductor manufacturing process according to an embodiment of the invention.

FIG. 8 is a flow chart of a semiconductor manufacturing process according to an embodiment of the invention. In the embodiment, the semiconductor manufacturing process includes providing a carrier (step S202). The detailed description of may be referred to in the description of FIG. 5A or FIG. 6A. Next, a cover is disposed at a periphery of the carrier (step S204). The detailed description of may be referred to in the description of FIG. 5C or FIG. 6B. Next, the carrier is coated with a first light absorption layer (step S206). The detailed description of may be referred to in the description of FIG. 5D or FIG. 6C. Next, the cover is removed from the carrier to reveal a notch at the periphery of the carrier (step S208). The detailed description of may be referred to in the description of FIG. 5E or FIG. 6D. The notch is light transmissive so as to expose the carrier to light in a normal direction of the carrier. In some embodiments, a light absorption layer may be coated on the carrier prior to step S206, and the detailed description may be referred to in FIG. 5B. In some embodiments, the semiconductor manufacturing process may also include providing a semiconductor layer on the light absorption layer, and providing a semiconductor package on the carrier. The semiconductor manufacturing process may also include debonding the light absorption layer from the carrier. The same description can be referred to in the previous embodiments.

According to some embodiments, a semiconductor manufacturing process includes providing a carrier. Next, the carrier is coated with a light absorption layer. Next, a portion of the light absorption layer at a periphery of the carrier is removed to form a notch in the light absorption layer at the periphery of the carrier. The notch is light transmissive so as to expose the carrier to light in a normal direction of the carrier.

According to some embodiments, a semiconductor manufacturing process includes providing a carrier. Next, a cover is disposed at a periphery of the carrier. Next, the carrier is coated with a first light absorption layer. Next, the cover is removed from the carrier to reveal a notch at the periphery of the carrier. The notch is light transmissive so as to expose the carrier to light in a normal direction of the carrier.

According to some embodiments, a package carrier includes a carrier and a light absorption layer. The light absorption layer is disposed on the carrier. The light absorption layer includes a notch at the periphery of the carrier, and the notch is light transmissive so as to expose the carrier to light in a normal direction of the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor manufacturing process comprising:
   providing a carrier;
   coating the carrier with a light absorption layer; and
   removing a portion of the light absorption layer at a periphery of the carrier to form a notch in the light absorption layer at the periphery of the carrier, and the light absorption layer remained directly below the notch has at least 10 percent of light transmittance so as to expose the carrier to light in a normal direction of the carrier.

2. The semiconductor manufacturing process as claimed in claim 1, further comprising:
   providing a semiconductor layer on the light absorption layer.

3. The semiconductor manufacturing process as claimed in claim 1, further comprising:
   debonding the light absorption layer from the carrier.

4. The semiconductor manufacturing process as claimed in claim 1, wherein in the step of removing the portion of the light absorption layer, the portion of the light absorption layer is completely removed in the normal direction to the carrier so as to expose a surface of the carrier.

5. The semiconductor manufacturing process as claimed in claim 1, wherein in the step of removing the portion of the light absorption layer, the portion of the light absorption layer is partially removed in the normal direction so that the light absorption layer remained directly below the notch has 10 to 90 percent of light transmittance.

6. The semiconductor manufacturing process as claimed in claim 1, wherein the light absorption layer includes a colorant, and the colorant absorbs infrared laser wavelengths.

7. A semiconductor manufacturing process comprising:
   providing a carrier;
   disposing a cover at a periphery of the carrier;
   coating the carrier with a first light absorption layer; and
   removing the cover from the carrier to reveal a notch at the periphery of the carrier, and the carrier is exposed to light in a normal direction of the carrier at the notch.

8. The semiconductor manufacturing process as claimed in claim 7, wherein prior to disposing the cover at a periphery of the carrier, the semiconductor manufacturing process further comprises:
   coating the carrier with a second light absorption layer, and the second light absorption layer is formed with at least 10 percent of light transmittance by adjusting a thickness of the second light absorption layer.

9. The semiconductor manufacturing process as claimed in claim 7, further comprising:
   providing a semiconductor layer on the first light absorption layer.

10. The semiconductor manufacturing process as claimed in claim 7, further comprising:
    providing a semiconductor package on the first light absorption layer; and
    debonding the first light absorption layer from the carrier.

11. The semiconductor manufacturing process as claimed in claim 7, wherein the notch at the periphery of the carrier exposes a surface of the carrier.

12. The semiconductor manufacturing process as claimed in claim 8, wherein the second light absorption layer is of 10 to 90 percent of light transmittance.

13. The semiconductor manufacturing process as claimed in claim 7, wherein the light absorption layer includes a colorant, and the colorant absorbs infrared laser wavelengths.

14. A semiconductor manufacturing process comprising:
    providing a carrier;
    forming a light absorption layer fully covering a surface of the carrier;
    thinning a portion of the light absorption layer located at a periphery part of the carrier to form a notch, so that a thickness of the light absorption layer at the notch is less than a thickness of the rest of the light absorption layer, wherein the thinned portion of the light absorption layer at the notch has 10 to 90 percent of light transmittance; and
    providing a semiconductor layer on the light absorption layer using the notch as an alignment mark for exposing the carrier to light.

15. The semiconductor manufacturing process as claimed in claim 14, further comprising debonding the light absorption layer from the carrier.

16. The semiconductor manufacturing process as claimed in claim 14, further comprising removing the thinned portion of the light absorption layer until the notch exposes the surface of the carrier, so that the carrier at the notch is exposed to the light.

17. The semiconductor manufacturing process as claimed in claim 16, wherein the semiconductor layer is provided on the light absorption layer and covering the surface of the carrier that is exposed by the notch.

18. The semiconductor manufacturing process as claimed in claim 14, wherein laser is applied to thin a portion of the light absorption layer.

19. The semiconductor manufacturing process as claimed in claim 14, wherein the light absorption layer includes a colorant, and the colorant absorbs infrared laser wavelengths.

20. The semiconductor manufacturing process as claimed in claim 14, wherein the light absorption layer is formed by coating.

* * * * *